US012635588B2

(12) United States Patent
Eguchi et al.

(10) Patent No.: US 12,635,588 B2
(45) Date of Patent: May 19, 2026

(54) SEMICONDUCTOR DEVICE AND CIRCUIT BOARD

(71) Applicant: Mitsubishi Electric Corporation, Tokyo (JP)

(72) Inventors: Keisuke Eguchi, Tokyo (JP); Takamasa Miyazaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 262 days.

(21) Appl. No.: 18/461,268

(22) Filed: Sep. 5, 2023

(65) Prior Publication Data

US 2024/0186302 A1 Jun. 6, 2024

(30) Foreign Application Priority Data

Dec. 2, 2022 (JP) ................................. 2022-193249

(51) Int. Cl.
H01L 23/495 (2006.01)
H01L 25/16 (2023.01)
(Continued)

(52) U.S. Cl.
CPC ...... H01L 25/162 (2013.01); H01L 23/49537 (2013.01); H01L 23/49541 (2013.01);
(Continued)

(58) Field of Classification Search
CPC .............. H05K 1/18; H05K 1/181–187; H01L 23/495; H01L 23/49537; H01L 23/49541;
(Continued)

(56) References Cited

U.S. PATENT DOCUMENTS

| | | | | |
|---|---|---|---|---|
| 5,444,297 A * | 8/1995 | Oshima | ................... | H01L 25/16 |
| | | | | 257/691 |
| 7,635,962 B2 * | 12/2009 | Suh | .................. | H03K 17/04123 |
| | | | | 318/801 |
| 7,692,285 B2 * | 4/2010 | Sato | .................. | H01L 23/49568 |
| | | | | 257/691 |
| 10,141,249 B2 * | 11/2018 | Niu | ................... | H01L 23/49575 |

(Continued)

FOREIGN PATENT DOCUMENTS

| | | |
|---|---|---|
| JP | H11-097617 A | 4/1999 |
| JP | 2003-018862 A | 1/2003 |

(Continued)

OTHER PUBLICATIONS

An Office Action, "Notice of Reasons for Refusal," mailed by the Japanese Patent Office on Oct. 21, 2025, which corresponds to Japanese Patent Application No. 2022-193249 and is related to U.S. Appl. No. 18/461,268; with English language translation.

(Continued)

*Primary Examiner* — Tuan T Dinh

(74) *Attorney, Agent, or Firm* — Studebaker Brackett PLLC

(57) ABSTRACT

An object is to provide a technique capable of mitigating the influence of external noise input to a semiconductor device. A semiconductor device includes semiconductor elements of multiple phases, control ICs of multiple phases that control driving of the semiconductor elements of multiple phases, respectively, and a plurality of control terminals provided for each phase and connected to the control ICs. In each phase, the plurality of control terminals includes input signal terminals, control power supply positive terminals connected to a positive side of control power supplies that supply power to the control ICs, and a plurality of control power supply GND terminals connected to reference potential of the control power supplies.

7 Claims, 7 Drawing Sheets

(51) Int. Cl.
  *H02M 7/537*    (2006.01)
  *H05K 1/18*    (2006.01)
  *H01L 23/00*    (2006.01)

(52) U.S. Cl.
  CPC ...... *H01L 23/49575* (2013.01); *H02M 7/537*
    (2013.01); *H05K 1/18* (2013.01); *H01L 24/48*
    (2013.01); *H01L 2224/48245* (2013.01); *H01L*
    *2224/48247* (2013.01); *H05K 2201/10015*
    (2013.01); *H05K 2201/1003* (2013.01); *H05K*
    *2201/10522* (2013.01); *H05K 2201/10545*
    (2013.01)

(58) Field of Classification Search
  CPC ........ H01L 23/49575; H01L 23/49562; H02M
    1/00; H02M 1/0006; H02M 1/08; H02M
    7/003; H02M 7/42
  USPC .......... 361/775–778, 803, 813; 257/690–723
  See application file for complete search history.

(56)          References Cited

U.S. PATENT DOCUMENTS

| | | | |
|---|---|---|---|
| 2003/0006434 A1 | 1/2003 | Kawafuji et al. | |
| 2003/0107120 A1* | 6/2003 | Connah ................... | H01L 25/16 |
| | | | 257/691 |
| 2017/0103962 A1 | 4/2017 | Oomae et al. | |
| 2022/0020730 A1* | 1/2022 | Katoh ................ | H01L 23/4334 |

FOREIGN PATENT DOCUMENTS

| | | |
|---|---|---|
| JP | 2013-090350 A | 5/2013 |
| WO | 2015/146130 A1 | 10/2015 |

OTHER PUBLICATIONS

An Office Action, "Decision of Refusal," mailed by the Japanese Patent Office on Mar. 17, 2026, which corresponds to Japanese Patent Application No. 2022-193249 and is related to U.S. Appl. No. 18/461,268; with English language translation.

* cited by examiner

F I G. 2
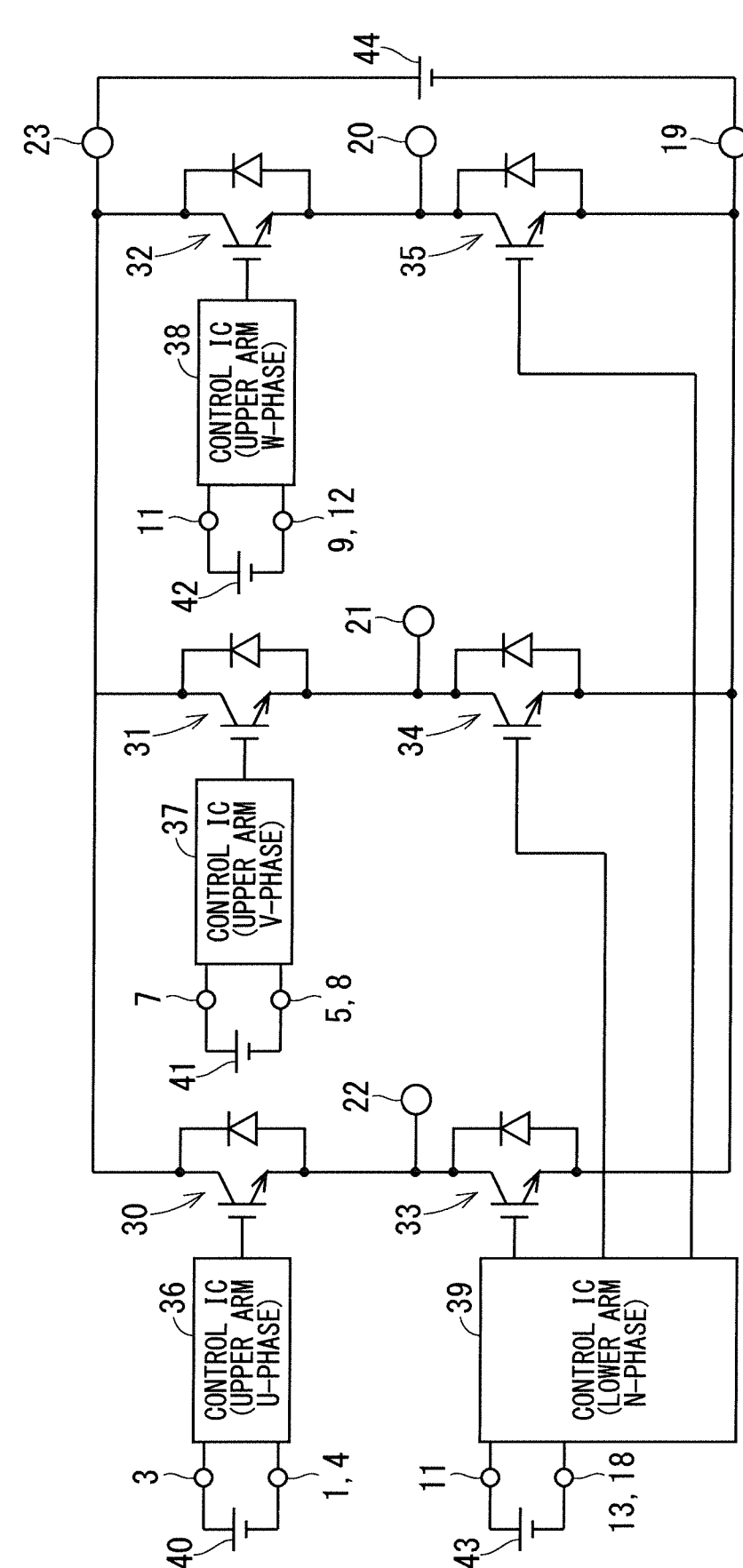
100

F I G. 4
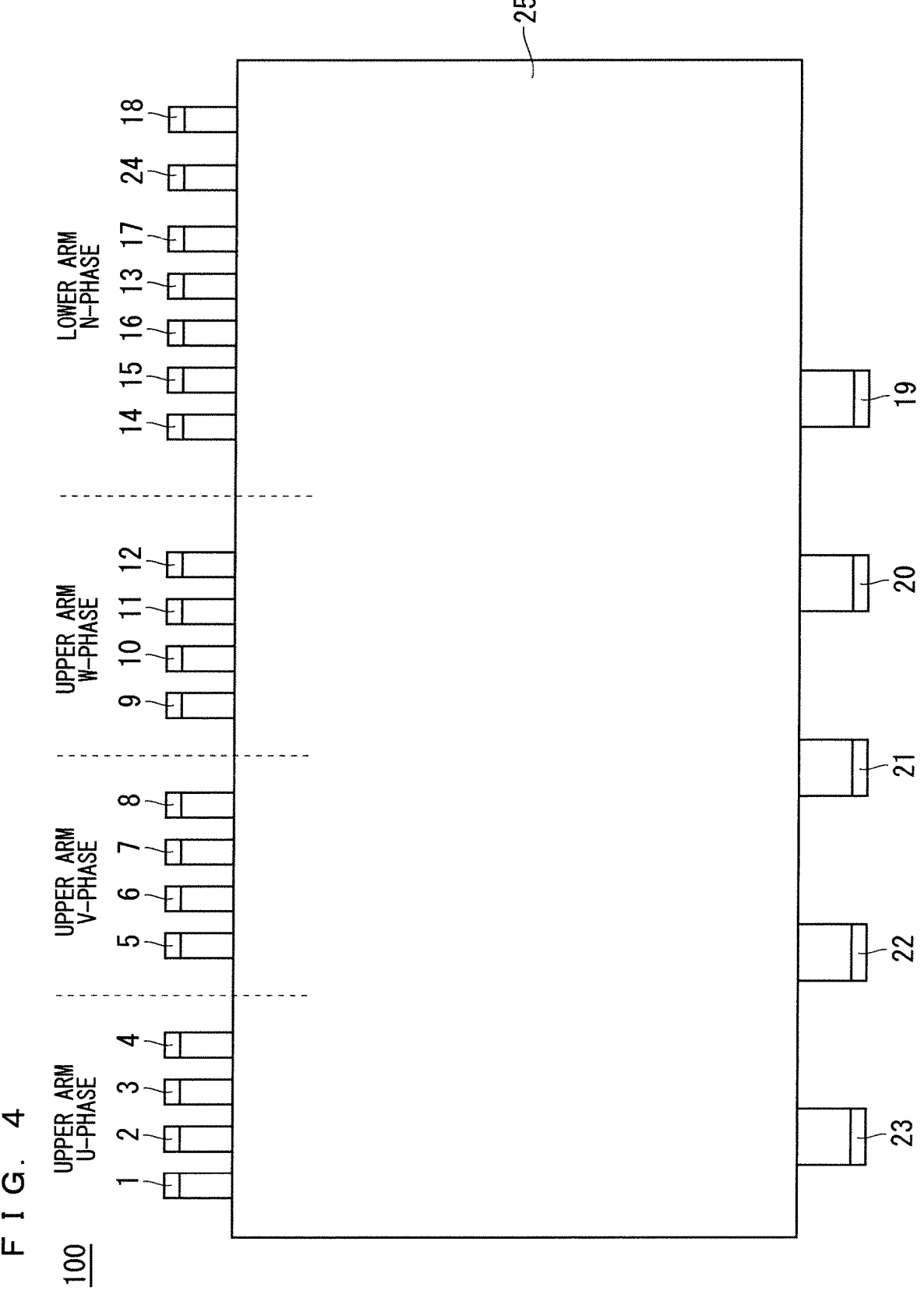

F I G. 5
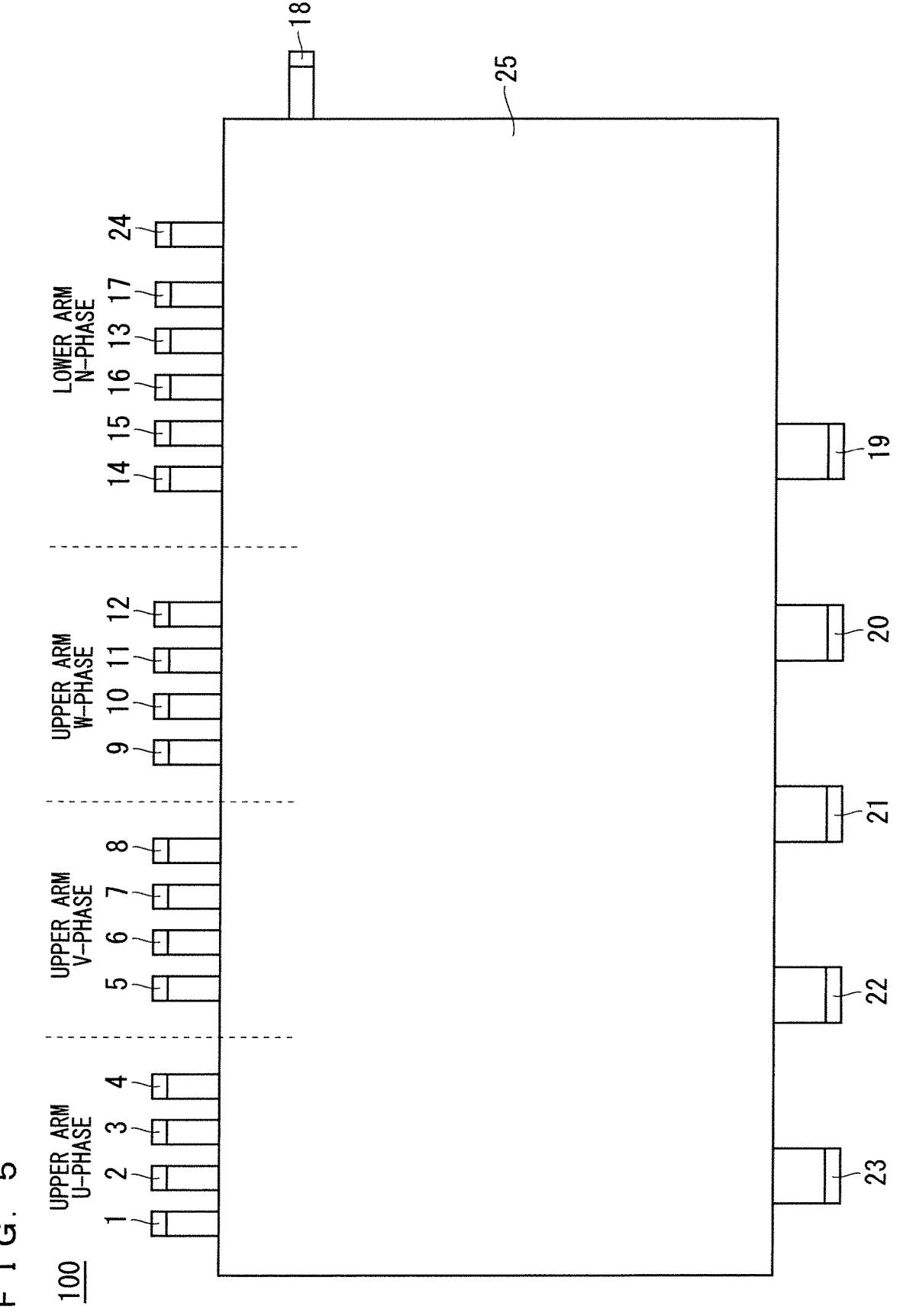

F I G. 6
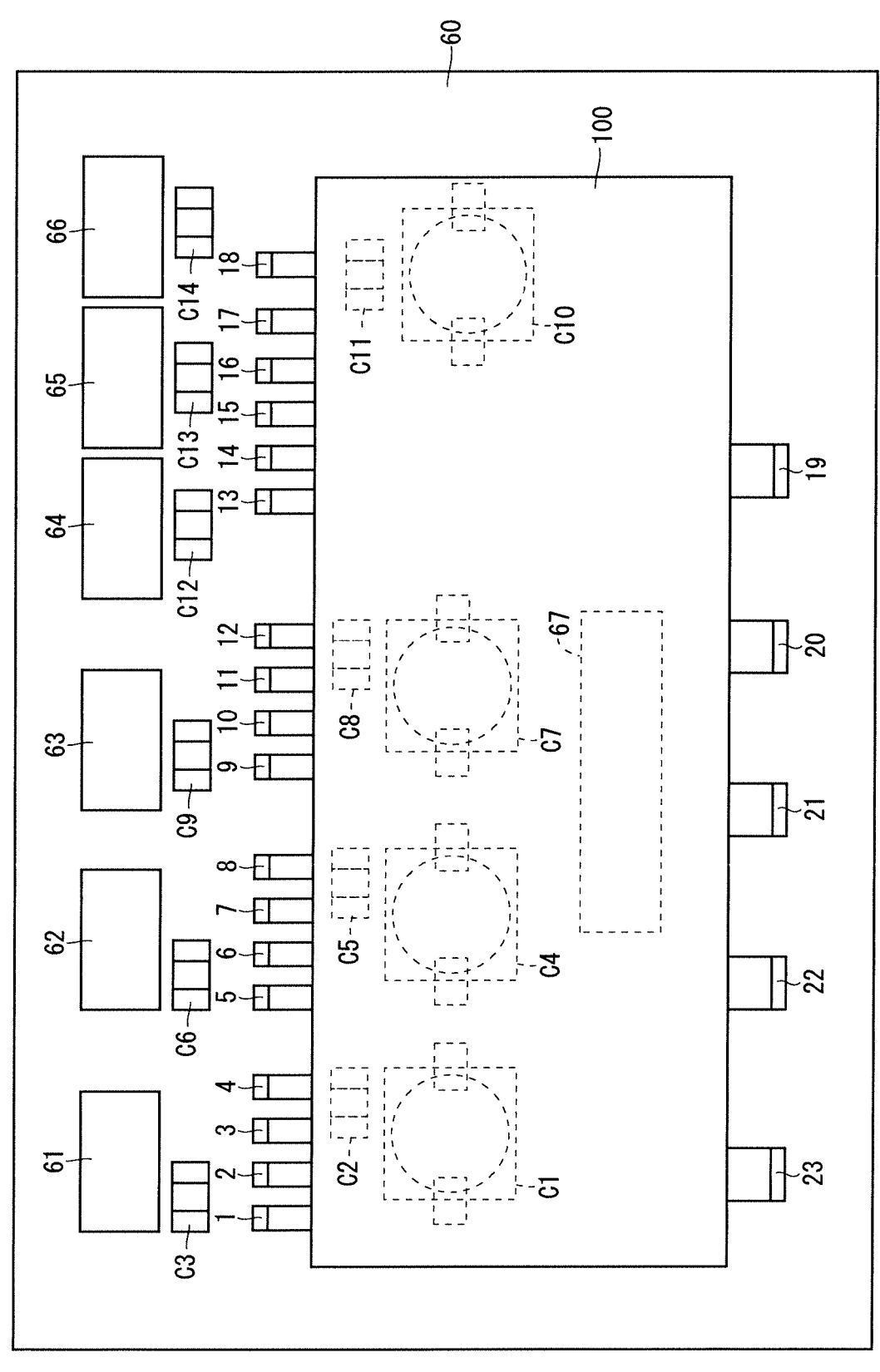

F I G. 7
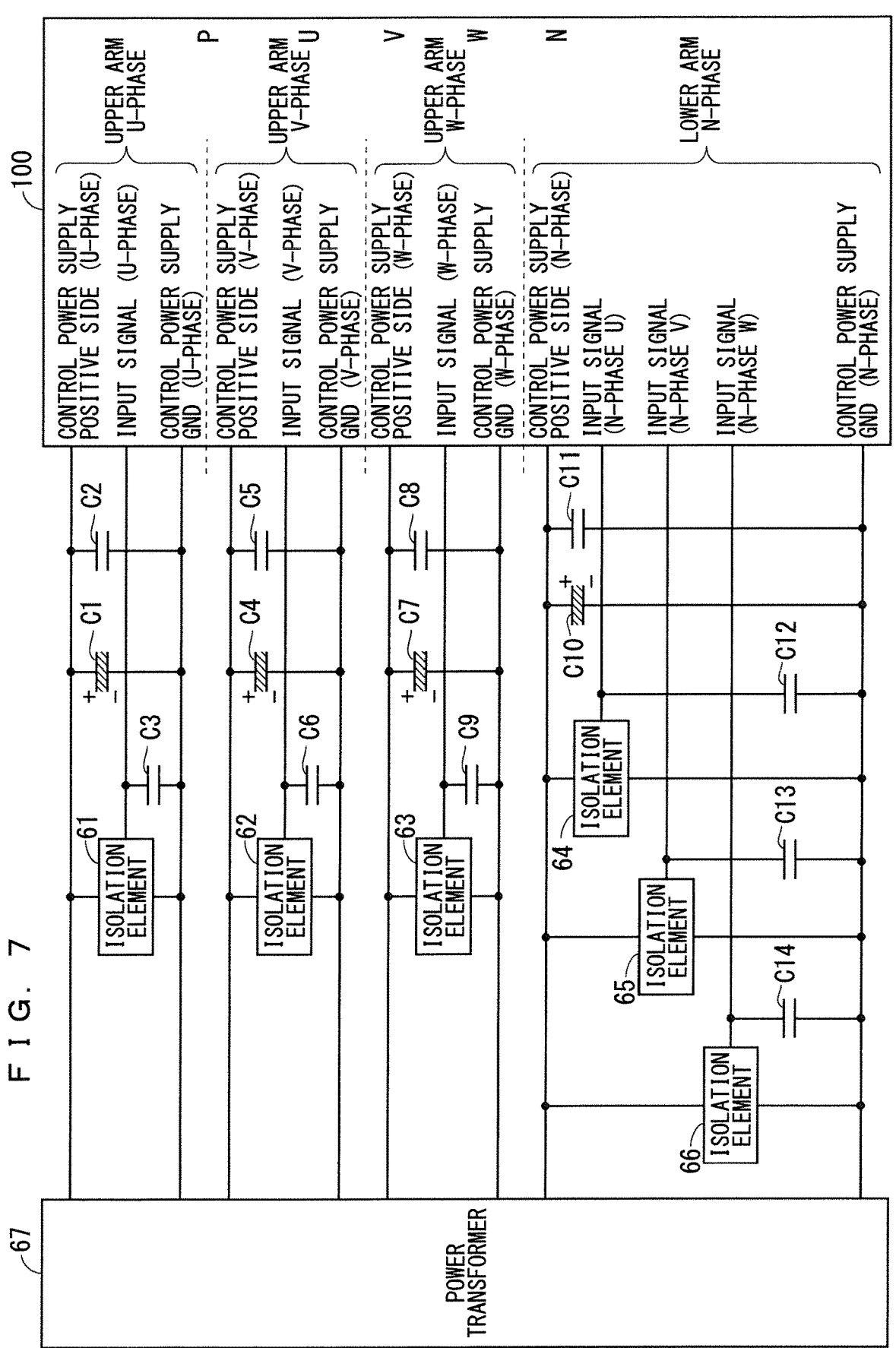

SEMICONDUCTOR DEVICE AND CIRCUIT BOARD

BACKGROUND OF THE INVENTION

Field of the Invention

The present disclosure relates to a semiconductor device and a circuit board.

Description of the Background Art

For example, in Japanese Patent Application Laid-Open No. 2003-18862, a technique is disclosed for increasing the creepage distance while miniaturizing a semiconductor device by considering the arrangement of a plurality of control terminals in a semiconductor device where a transistor (corresponding to a semiconductor element) that constitutes a three-phase inverter and a control IC that controls the transistor are sealed in a mold.

However, in the technique described in Japanese Patent Application Laid-Open No. 2003-18862, while the arrangement of control terminals between different phases is taken into consideration, the arrangement of control terminals within the same phase is not taken into consideration. As a result, when external noise is input to the semiconductor device, the input terminal with high impedance may operate at an unintended timing, causing malfunctions in the semiconductor device.

SUMMARY

An object of the present disclosure is to provide a technique capable of mitigating the influence of external noise input to a semiconductor device.

A semiconductor device according to the present disclosure includes semiconductor elements of multiple phases, control ICs of multiple phases, and a plurality of control terminals. The control ICs of multiple phases control driving of the semiconductor elements of multiple phases, respectively. The plurality of control terminals are provided for each phase and connected to the control ICs. In each phase, the plurality of control terminals have input signal terminals, control power supply positive terminals, and a plurality of control power supply GND terminals. The control power supply positive terminals are connected to a positive side of control power supplies that supply power to the control ICs. The plurality of control power supply GND terminals are connected to reference potential of the control power supplies.

The influence of external noise input to the semiconductor device is mitigated more than when each phase has one control power supply GND terminal.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a circuit diagram of the semiconductor device according to Embodiment 1;

FIG. 4 is a top view of a semiconductor device according to Modification 1 of Embodiment 1;

FIG. 5 is a top view of a semiconductor device according to Modification 2 of Embodiment 1;

FIG. 6 is a top view of a semiconductor device according to Embodiment 2 and a circuit board on which the semiconductor device is mounted; and FIG. 7 is a circuit diagram illustrating connection between the semiconductor device according to Embodiment 2 and a power transformer.

DESCRIPTION OF THE PREFERRED EMBODIMENTS

Embodiment 1

Figure 1:
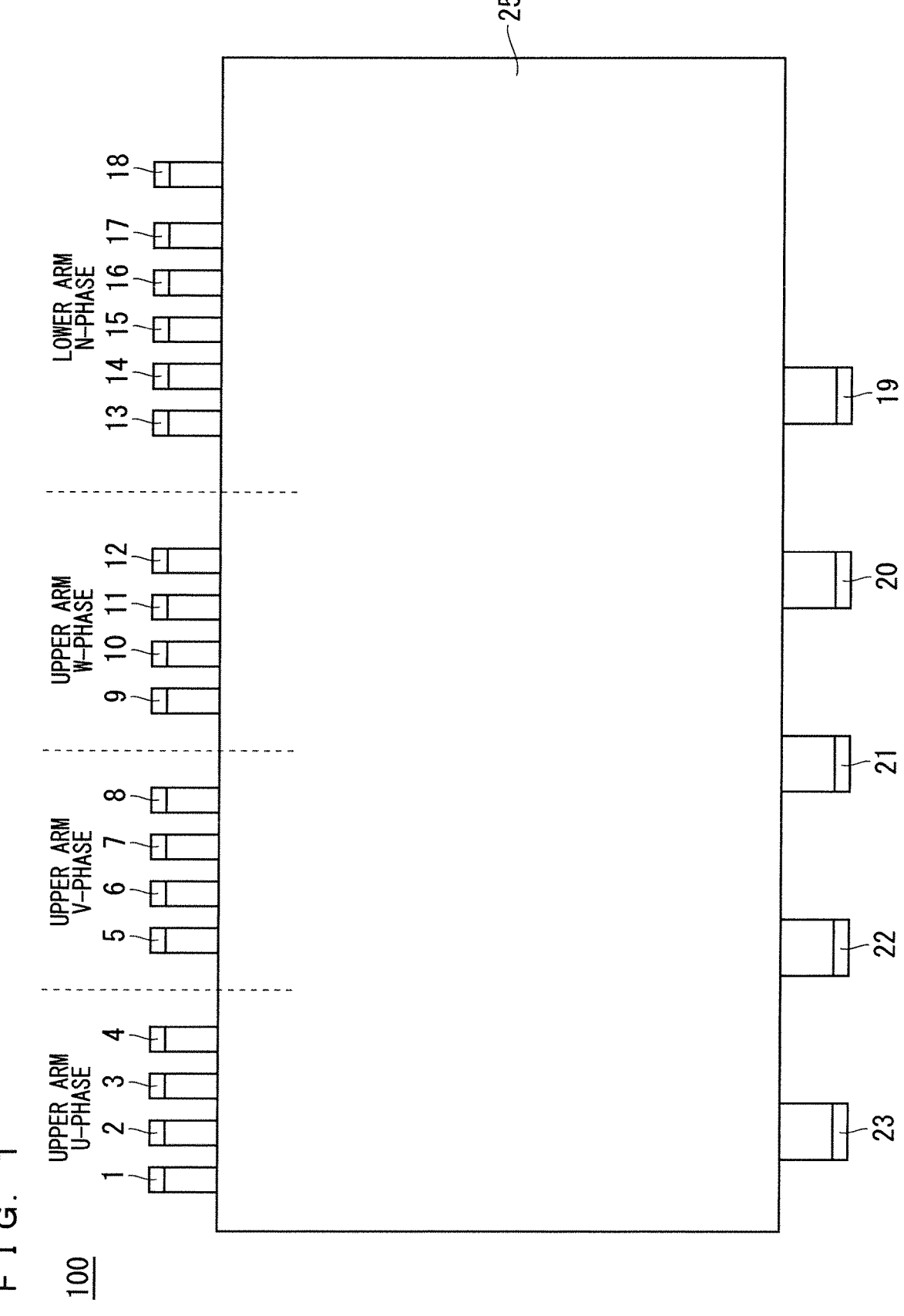
FIG. 1 is a top view of a semiconductor device according to Embodiment 1.

Embodiment 1 will be described with reference to the drawings. FIG. 1 is a top view of a semiconductor device 100 according to Embodiment 1. FIG. 2 is a circuit diagram of the semiconductor device 100 according to Embodiment 1.

As illustrated in FIGS. 1 and 2, the semiconductor device 100 includes multi-phase semiconductor elements 30, 31, 32, 33, 34, 35, multi-phase control ICs 36, 37, 38, 39, multi-phase control power supplies 40, 41, 42, 43, a mold resin 25, and a plurality of control terminals.

The semiconductor elements 30 and 33, the semiconductor elements 31 and 34, and the semiconductor elements 32 and 35 constitute an inverter. Each semiconductor element 30, 31, 32, 33, 34, 35 is a reverse conducting IGBT (RC-IGBT). The semiconductor elements 30, 31, 32, 33, 34, 35 may be Insulated Gate Bipolar Transistors (IGBTs) or Metal Oxide Semiconductor Field Effect Transistors (MOS-FETs) instead of reverse conducting IGBTs.

Control ICs 36, 37, 38 control driving of the semiconductor elements 30, 31, 32 by outputting gate signals to the semiconductor elements 30, 31, 32, respectively. Similarly, control IC 39 controls driving of the semiconductor elements 33, 34, 35 by outputting gate signals to the semiconductor elements 33, 34, 35.

Control power supplies 40, 41, 42, 43 are connected to the control ICs 36, 37, 38, 39, respectively. The control power supplies 40, 41, 42, 43 supplies power to the control ICs 36, 37, 38, 39, respectively.

A mold resin 25 seals a circuit of the semiconductor device 100 including the semiconductor elements 30, 31, 32, 33, 34, 35 and the control ICs 36, 37, 38, 39. The mold resin 25 has a rectangular shape in top view, and constitutes a package of the semiconductor device 100.

The mold resin 25 has two long sides and two short sides in top view. A plurality of control terminals are arranged for each phase along one long side of the mold resin 25. Specifically, a first control power supply GND terminal 1, an input signal terminal 2, a control power supply positive terminal 3, and a second control power supply GND terminal 4, which are a plurality of control terminals in an upper arm U-phase, a first control power supply GND terminal 5, an input signal terminal 6, a control power supply positive terminal 7, and a second control power supply GND terminal 8, which are a plurality of control terminals in an upper arm V-phase, a first control power supply GND terminal 9, an input signal terminal 10, a control power supply positive terminal 11, and a second control power supply GND terminal 12, which are a plurality of control terminals in an upper arm W-phase, a first control power supply GND terminal 13, an input signal terminal 14, an input signal terminal 15, an input signal terminal 16, a control power supply positive terminal 17, and a second control power supply GND terminal 18, which are a plurality of control terminals in a lower arm N-phase, are arranged in this order along one long side of mold resin 25.

Here, each phase refers to the upper arm U-phase, the upper arm V-phase, the upper arm W-phase, and the lower arm N-phase.

The input signal terminals 2, 6, 10, 14, 15, 16 are terminals to which input signals are input. The control power supply positive terminals 3, 7, 11, 17 are terminals connected to the positive side of the control power supplies 40, 41, 42, 43, respectively. The first control power supply GND terminals 1, 5, 9, 13 and the second control power supply GND terminals 4, 8, 12, 18 are terminals connected to the reference potential of the control power supplies 40, 41, 42, 43, respectively.

Main terminals 19, 20, 21, 22, 23 are arranged along an other long side of the mold resin 25 that faces the one long side. The main terminal 23 is connected to the collectors of the semiconductor elements 30, 31, 32, and the main terminal 19 is connected to the emitters of the semiconductor elements 33, 34, 35. A main power supply 44 is connected between the main terminal 23 and the main terminal 19.

The main terminal 20 is the output of an inverter composed of the semiconductor element 32 and the semiconductor element 35. The main terminal 21 is the output of an inverter composed of the semiconductor element 31 and the semiconductor element 34. The main terminal 22 is the output of an inverter composed of the semiconductor element 30 and the semiconductor element 33.

In each phase, the first control power supply GND terminals 1, 5, 9, 13 and the second control power supply GND terminals 4, 8, 12, 18 are arranged at both ends, and the input signal terminals 2, 6, 10, 14, 15, 16 and the control power supply positive terminals 3, 7, 11, 17 are arranged between the first control power supply GND terminals 1, 5, 9, 13 and the second control power supply GND terminals 4, 8, 12, 18.

Specifically, the input signal terminal 2 and the control power supply positive terminal 3 are arranged between the first control power supply GND terminal 1 and the second control power supply GND terminal 4, and the input signal terminal 6 and the control power supply positive terminal 7 are arranged between the first control power supply GND terminal 5 and the second control power supply GND terminal 8. Also, the input signal terminal 10 and the control power supply positive terminal 11 are arranged between the first control power supply GND terminal 9 and the second control power supply GND terminal 12, and the input signal terminals 14, 15, 16 and the control power supply positive terminal 17 are arranged between the first control power supply GND terminal 13 and the second control power supply GND terminal 18.

Next, the distance between control terminals adjacent to each other will be described. As illustrated in FIG. 1, the distance between the control terminals adjacent to each other in different phases is twice or more than the distance between the control terminals adjacent to each other in the same phase. For example, the distance between the second control power supply GND terminal 4 in the upper arm U-phase and the first control power supply GND terminal 5 in the upper arm V-phase, which are the control terminals adjacent to each other in different phases, is more than twice the distance between the control power supply positive terminal 7 and the second control power supply GND terminal 8 in the upper arm V-phase, which are the control terminals adjacent to each other in the same phase. This enables to secure the spatial distance between different phases. Spatial distances between different phases are determined by the environment of use. For example, when the main power supply 44 is of the AC 200 V system, it is desirable that the spatial distance between different phases is 5 mm or more.

Figure 3:
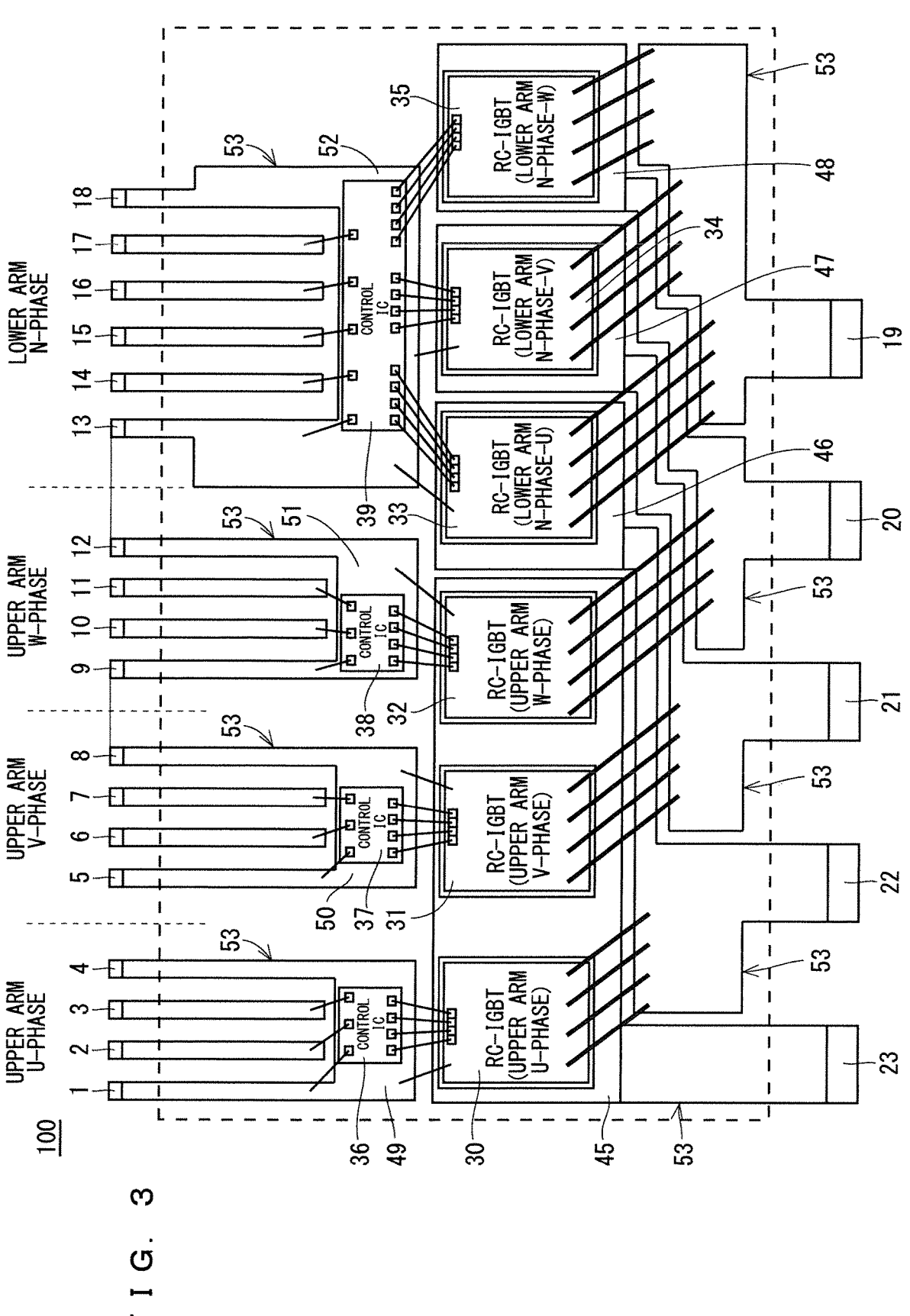
FIG. 3 is an internal wiring diagram of the semiconductor device according to Embodiment 1.

Next, internal wiring of the semiconductor device 100 will be described. FIG. 3 is an internal wiring diagram of the semiconductor device 100 according to Embodiment 1.

As illustrated in FIG. 3, inside the semiconductor device 100, a plurality of lead frames 53, which are metal frames, are provided. The plurality of lead frames 53 have die pads 45, 46, 47, 48, 49, 50, 51, 52, respectively.

In each phase, the first control power supply GND terminals 1, 5, 9, 13, the second control power supply GND terminals 4, 8, 12, 18, and the die pads 49, 50, 51, 52 on which the control ICs 36, 37, 38, 39 are mounted, are composed of the respective lead frames 53 integrally formed therewith. Specifically, the first control power supply GND terminal 1 and the second control power supply GND terminal 4, and the die pad 49 on which the control IC 36 is mounted, is composed of the lead frame 53 integrally formed therewith. The first control power supply GND terminal 5 and the second control power supply GND terminal 8, and the die pad 50 on which the control IC 37 is mounted, is composed of the lead frame 53 integrally formed therewith. The first control power supply GND terminal 9 and the second control power supply GND terminal 12, and the die pad 51 on which the control IC 38 is mounted, is composed of the lead frame 53 integrally formed therewith. The first control power supply GND terminal 13 and the second control power supply GND terminal 18, and the die pad 52 on which the control IC 39 is mounted, is composed of the lead frame 53 integrally formed therewith. With this configuration, the back surfaces of the control ICs 36, 37, 38, 39 have the potential equal to the reference potential of the control power supplies 40, 41, 42, 43, respectively.

Further, the semiconductor elements 30, 31, 32 are mounted on a common die pad 45, and the semiconductor elements 33, 34, 35 are mounted on die pads 46, 47, 48, respectively.

The semiconductor elements 30, 31, 32, 33, 34, 35 and the control ICs 36, 37, 38, 39 are wire-connected. Also, the semiconductor elements 30, 31, 32, 33, 34, 35 and the lead frame 53 provided with the main terminals 22, 21, 20, 19 are wire-connected, and the control ICs 36, 37, 38, 39 and the lead frames 53 provided with the control terminals are also wire-connected.

As described above, the semiconductor device 100 according to Embodiment 1 includes the semiconductor elements 30, 31, 32, 33, 34, 35 of multiple phases and the control ICs 36, 37, 38, 39 each control the semiconductor elements 30, 31, 32, 33, 34, 35, and the plurality of control terminals provided for each phase and connected to the control ICs 36, 37, 38, 39. In each phase, the plurality of control terminals includes the input signal terminals 2, 6, 10, 14, 15, 16, the control power supply positive terminals 3, 7, 11, 17 connected to the positive side of the control power supplies 40, 41, 42, 43 that supply power to the control ICs 36, 37, 38, 39, and the plurality of control power supply GND terminals connected to the reference potential of the control power supplies 40, 41, 42, 43.

The semiconductor device 100 further includes the mold resin 25 that seals the semiconductor elements 30, 31, 32, 33, 34, 35 of multiple phases and the control ICs 36, 37, 38, 39 of multiple phases. The plurality of control power supply GND terminals includes the first control power supply GND terminals 1, 5, 9, 13 and the second control power supply GND terminals 4, 8, 12, 18 in each phase. The plurality of control terminals provided for each phase are arranged for each phase along one side of the mold resin 25. In each phase, the input signal terminals 2, 6, 10, 14, 15, 16 and the control power supply positive terminals 3, 7, 11, 17 are arranged between the first control power supply GND terminals 1, 5, 9, 13 and the second control power supply GND terminals 4, 8, 12, 18.

Having high impedance, the input signal terminals 2, 6, 10, 14, 15, 16 are susceptible to the influence of external noise input to the semiconductor device 100. However, in each phase, the plurality of control terminals with a plurality of control power supply GND terminals can mitigate the influence of external noise input to the semiconductor device 100 more than when each phase has one control power supply GND terminal.

Reducing the influence of external noise eliminates the need for noise countermeasures in the semiconductor device 100, thereby improving the handleability of the semiconductor device 100.

Further, in each phase, the first control power supply GND terminals 1, 5, 9, 13, the second control power supply GND terminals 4, 8, 12, 18, and the die pads 49, 50, 51, 52 on which the control ICs 36, 37, 38, 39 are mounted, are composed of the respective lead frames 53, which are metal frames, integrally formed therewith.

When a short-circuit current occurs inside the semiconductor device 100, in some cases, a minute current flows into the control ICs 36, 37, 38, 39. The minute current is then directed to flow outside the control ICs 36, 37, 38, 39 due to the back surfaces of the control ICs 36, 37, 38, 39 having an equal potential to the reference potential of the control power supplies 40, 41, 42, 43. Consequently, the semiconductor device 100 is prevented from being broken when a short circuit occurs, improving the reliability of the semiconductor device 100.

Modification of Embodiment 1

Next, Modifications 1 and 2 of Embodiment 1 will be described. FIG. 4 is a top view of a semiconductor device 100 according to Modification 1 of Embodiment 1. FIG. 5 is a top view of a semiconductor device 100 according to Modification 2 of Embodiment 1.

As illustrated in FIG. 4, the control terminals of the lower arm N-phase further include an error signal output terminal 24. In this case, the control terminals of the lower arm N-phase are arranged in the following order; the input signal terminal 14, the input signal terminal 15, the input signal terminal 16, the first control power supply GND terminal 13, the control power supply positive terminal 17, the error signal output terminal 24, and the second control power supply GND terminal 18.

The influence of external noise can be mitigated more by placing the first control power supply GND terminal 13 between the input signal terminal 16 and the error signal output terminal 24 than placing the first control power supply GND terminal 13 at the end because the error signal output terminal 24 has high impedance.

Also, as illustrated in FIG. 5, the second control power supply GND terminal 18 may be arranged near the error signal output terminal 24 on the short side of the mold resin 25. Also in this case, the same effect as in the case of FIG. 4 can be obtained.

Embodiment 2

Next, the semiconductor device 100 and the circuit board 60 according to Embodiment 2 will be described. FIG. 6 is a top view of the semiconductor device 100 according to Embodiment 2 and the circuit board 60 on which the semiconductor device 100 is mounted. FIG. 7 is a circuit diagram illustrating connection between the semiconductor device 100 according to Embodiment 2 and the power transformer 67. In Embodiment 2, the same components as those described in Embodiment 1 are denoted by the same reference numerals and the description thereof will be omitted.

As illustrated in FIG. 6, in Embodiment 2, the semiconductor device 100 is mounted on the circuit board 60 together with isolation elements 61, 62, 63, 64, 65, 66 provided for each phase, input signal capacitors C3, C6, C9, C12, C13, C14 provided for each phase, control power supply capacitors C1, C2, C4, C5, C7, C8, C10, C11 provided for each phase, and the power transformer 67.

Specifically, the semiconductor device 100, the isolation elements 61, 62, 63, 64, 65, 66, and the input signal capacitors C3, C6, C9, C12, C13, C14 are mounted on the upper surface of the circuit board 60. The control power supply capacitors C1, C2, C4, C5, C7, C8, C10, C11 and the power transformer 67 are mounted on the lower surface of the circuit board 60.

In each phase, the first control power supply GND terminals 1, 5, 9, 13 and the input signal terminals 2, 6, 10, 14, 15, 16 are connected to the isolation elements 61, 62, 63, 64, 65, 66 and the input signal capacitors C3, C6, C9, C12, C13, C14 via circuit patterns provided on the upper and lower surfaces of the circuit board 60, and the second control power supply GND terminals 4, 8, 12, 18 and the control power supply positive terminals 3, 7, 11, 17 are connected to the control power supply capacitors C1, C2, C4, C5, C7, C8, C10, C11 and power transformer 67 via the circuit patterns provided on the upper and lower surfaces of the circuit board 60.

The isolation elements 61, 62, 63, 64, 65, 66 are isolation elements including microtransformers, or isolation driver ICs incorporating a drive circuit and a protection circuit therein.

Note that the number of semiconductor devices 100 mounted on the circuit board 60 is not limited to one, and may be plural. Further, as the semiconductor device 100, the semiconductor devices 100 according to Modifications 1 and 2 of Embodiment 1 may also be mounted.

As described above, on the circuit board 60 according to Embodiment 2 the semiconductor device 100, the isolation elements 61, 62, 63, 64, 65, 66 provided for each phase, the input signal capacitors C3, C6, C9, C12, C13, C14 provided for each phase, the control power supply capacitors C1, C2, C4, C5, C7, C8, C10, C11 provided for each phase, and the power transformer 67 are mounted. In each phase, the first control power supply GND terminals 1, 5, 9, 13 and the input signal terminals 2, 6, 10, 14, 15, 16 are connected to the isolation elements 61, 62, 63, 64, 65, 66 and the input signal capacitors C3, C6, C9, C12, C13, C14, and the second control power supply GND terminals 4, 8, 12, 18 and the control power supply positive terminals 3, 7, 11, 17 are connected to the control power supply capacitors C1, C2, C4, C5, C7, C8, C10, C11 and the power transformer 67.

Accordingly, while mitigating the influence of external noise, the components mounted on the circuit board 60 are made highly integrated, which contributes to the miniaturization of the circuit board 60.

Further, the isolation elements 61, 62, 63, 64, 65, 66 are the isolation elements including microtransformers, or isolation driver ICs incorporating a drive circuit and a protection circuit therein; therefore, the isolation elements 61, 62,

63, 64, 65, 66 are made highly integrated, which can also handle high-speed switching of the semiconductor elements 30, 31, 32, 33, 34, 35. Contribution is also made to miniaturization of the circuit board 60.

In addition, a plurality of semiconductor devices 100 are mounted, which promotes further densification of the circuit board 60, making contribution to further miniaturization of the circuit board 60.

It should be noted that Embodiments can be arbitrarily combined and can be appropriately modified or omitted.

Hereinafter, the aspects of the present disclosure will be collectively described as Appendices.

APPENDIX 1

A semiconductor device comprising:
semiconductor elements of multiple phases;
control ICs of multiple phases that control driving of the semiconductor elements of multiple phases, respectively; and
a plurality of control terminals provided for each phase and connected to the control ICs, wherein
in each phase, the plurality of control terminals includes input signal terminals, control power supply positive terminals connected to a positive side of control power supplies that supply power to the control ICs, and a plurality of control power supply GND terminals connected to reference potential of the control power supplies.

APPENDIX 2

The semiconductor device according to Appendix 1, wherein in each phase, the plurality of control power supply GND terminals and die pads on which the control ICs are mounted are composed of metal frames integrally formed therewith.

APPENDIX 3

The semiconductor device according to Appendix 1 or 2, further comprising
a mold resin that seals the semiconductor elements of multiple phases and the control ICs of multiple phases, wherein
in each phase, the plurality of control power supply GND terminals includes first control power supply GND terminals and second control power supply GND terminals,
the plurality of control terminals provided for each phase are arranged for each phase along one side of the mold resin, and
in each phase, the input signal terminals and the control power supply positive terminals are arranged between the first control power supply GND terminals and the second control power supply GND terminals.

APPENDIX 4

The semiconductor device according to any one of Appendices 1 to 3, wherein
a distance between the control terminals adjacent to each other in different phases is twice or more than a distance between the control terminals adjacent to each other in a same phase.

APPENDIX 5

A circuit board, wherein
the semiconductor device according to Appendix 3, insulation elements provided for each phase, input signal capacitors provided for each phase, control power supply capacitors provided for each phase, and a power transformer are mounted thereon, and
in each phase, the first control power supply GND terminals and the input signal terminals are connected to the isolation elements and the input signal capacitors, and the second control power supply GND terminals and the control power supply positive terminals are connected to the control power supply capacitors and power transformer.

APPENDIX 6

The circuit board according to Appendix 5, wherein
the isolation elements are the isolation elements including microtransformers, or isolation driver ICs incorporating a drive circuit and a protection circuit therein.

APPENDIX 7

The circuit board according to Appendices 5 or 6, wherein
a plurality of the semiconductor devices are mounted thereon.

While the invention has been illustrated and described in detail, the foregoing description is in all aspects illustrative and not restrictive. It is therefore understood that numerous modifications and variations can be devised without departing from the scope of the invention.

What is claimed is:

1. A semiconductor device comprising:
semiconductor elements of multiple phases;
control ICs of multiple phases that control driving of the semiconductor elements of multiple phases, respectively;
a plurality of control terminals provided for each phase and connected to the control ICs; and
a mold resin that seals the semiconductor elements of multiple phases and the control ICs of multiple phases, wherein
in each phase, the plurality of control terminals includes input signal terminals, control power supply positive terminals connected to a positive side of control power supplies that supply power to the control ICs, and a plurality of control power supply GND terminals connected to reference potential of the control power supplies,
in each phase, the plurality of control power supply GND terminals includes first control power supply GND terminals and second control power supply GND terminals, and
in each phase, the input signal terminals and the control power supply positive terminals are arranged between the first control power supply GND terminals and the second control power supply GND terminals.

2. The semiconductor device according to claim 1, wherein
in each phase, the plurality of control power supply GND terminals and die pads on which the control ICs are mounted are composed of metal frames integrally formed therewith.

3. The semiconductor device according to claim 1, wherein
the plurality of control terminals provided for each phase are arranged for each phase along one side of the mold resin.

4. The semiconductor device according to claim 1, wherein a distance between the control terminals adjacent to each other in different phases is twice or more than a distance between the control terminals adjacent to each other in a same phase.

5. A circuit board, comprising:

the semiconductor device according to claim 3, further comprising isolation elements provided for each phase, input signal capacitors provided for each phase, control power supply capacitors provided for each phase, and a power transformer are mounted thereon, and in each phase, the first control power supply GND terminals and the input signal terminals are connected to the isolation elements and the input signal capacitors, and the second control power supply GND terminals and the control power supply positive terminals are connected to the control power supply capacitors and power transformer.

6. The circuit board according to claim 5, wherein the isolation elements are the isolation elements including microtransformers, or isolation driver ICs incorporating a drive circuit and a protection circuit therein.

7. The circuit board according to claim 5, wherein a plurality of the semiconductor devices are mounted thereon.

* * * * *